US008564848B2

(12) United States Patent
Shimoyama et al.

(10) Patent No.: US 8,564,848 B2
(45) Date of Patent: Oct. 22, 2013

(54) OPERATION DEVICE AND IMAGE READING APPARATUS

(75) Inventors: Noboru Shimoyama, Yokohama (JP); Hiroshi Ogushi, Shiroi (JP); Yasushi Ishida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 307 days.

(21) Appl. No.: 13/074,497

(22) Filed: Mar. 29, 2011

(65) Prior Publication Data

US 2011/0299134 A1 Dec. 8, 2011

(30) Foreign Application Priority Data

Jun. 8, 2010 (JP) ................................ 2010-131253

(51) Int. Cl.
*H04N 1/40* (2006.01)
*H04N 1/04* (2006.01)
*G06F 3/045* (2006.01)
*F21V 7/04* (2006.01)

(52) U.S. Cl.
USPC ........... 358/471; 358/474; 358/400; 345/173; 345/174; 362/609

(58) Field of Classification Search
None
See application file for complete search history.

(56) References Cited

U.S. PATENT DOCUMENTS

| 2007/0152977 | A1* | 7/2007 | Ng et al. ....................... 345/173 |
| 2009/0033636 | A1 | 2/2009 | Toyota et al. |
| 2011/0242571 | A1* | 10/2011 | Ogushi et al. ................ 358/1.13 |
| 2011/0242612 | A1* | 10/2011 | Tsubakimoto et al. ....... 358/442 |
| 2011/0242613 | A1* | 10/2011 | Ishida et al. .................. 358/442 |
| 2011/0299129 | A1* | 12/2011 | Ishida et al. .................. 358/442 |
| 2011/0299142 | A1* | 12/2011 | Shimoyama et al. ......... 358/475 |

FOREIGN PATENT DOCUMENTS

JP 11-283425 A 10/1999
JP 2009-88759 A 4/2009

* cited by examiner

*Primary Examiner* — Cheukfan Lee
(74) *Attorney, Agent, or Firm* — Canon USA Inc. IP Division

(57) ABSTRACT

On a bottom surface of a light guide element of an operation device including a panel with a light-transmissive portion, a reflection portion is formed in a first region thereof, which is close to a light source, and a first diffusion surface is formed in a second region of the bottom surface of the light guide element, which is a region distant from the light source. A light-incident side of the light guide element is a non-diffusion surface. Sides other than the light-incident side are second diffusion surfaces. Light that has been emitted from the light source and incident to the light guide element via the light-incident side is totally reflected and is then guided to the first and the second diffusion surfaces and a part of diffusion-reflected light illuminates the light-transmissive portion of the panel.

7 Claims, 5 Drawing Sheets

OPERATION DEVICE AND IMAGE READING APPARATUS

BACKGROUND OF THE INVENTION

1. Field of the Invention

The present invention generally relates to imaging and, more particularly, to an operation device including a touch switch and an image processing apparatus including the operation device.

2. Description of the Related Art

Japanese Patent Application Laid-Open No. 2009-88759 discusses a multifunction peripheral (MFP) which includes an image reading unit. The device includes a reading unit, which is configured to read an image of a document set on a reading surface, and a pressing plate, which can open on the reading surface. On an upper surface of the pressing plate, an operation unit, which includes a plurality of input keys, and a display device, such as a liquid crystal display (LCD) panel, are provided.

U.S. Patent Application Publication No. 2009/0033636 A1 discusses a capacitive touch panel input device. The capacitive touch panel input device includes a substrate and a spacer. A plurality of sensor electrodes is implemented on the capacitive touch panel input device. The spacer is set on each sensor electrode.

Japanese Patent Application Laid-Open No. 11-283425 discusses an illumination device (a backlight), which illuminates an LCD display device that displays a character and a graphic with light from the back thereof. Another conventional method discussed in the Japanese Patent Application Laid-Open No. 2009-88759 includes an operation unit that has a structure of a mechanical-contact key, such as a tactile switch. However, in terms of lower costs and appropriate component arrangement and design, the operation unit can be replaced with the capacitance touch switch, such as the one discussed in the U.S. Patent Application Publication No. 2009/0033636 A1.

In this case, the visibility of the switch can be increased by using a backlight (an illumination device) provided behind the switch. In addition, in this case, the operability of the capacitive touch panel input device also can be increased by turning off the backlight if it is not necessary to use the backlight.

The above-described structure of the conventional operation unit may not be implemented if uneven luminosity occurs and if a large number of light sources are required. In other words, in order to implement the above-described structure of the conventional operation unit, if the area of a region of the touch switch to be illuminated with light is large, it is required to illuminate the touch switch from behind with light intense enough to increase the visibility of the touch switch to a highly visible level and to reduce uneven luminosity with the smallest possible number of light sources.

The illumination device discussed in the Japanese Patent Application Laid-Open No. 11-283425 forms a reflection surface in a region of a light guide plate (8) having a limited area to illuminate the touch switch with highly intense light. In addition, an exit window (11), which has a white cover frame, is provided limitedly for the display range to prevent leaking light. However, in order to illuminate the necessary range of a large area with light by using the smallest possible number of light sources, the structure of the operation unit discussed in the Japanese Patent Application Laid-Open No. 11-283425 may not be useful enough.

In other words, a part of the light guided to a side of the light guide plate (8) may exit from another side thereof. Accordingly, the light utilization efficiency may become low. In addition, in this case, the brightness may become uneven.

The conventional method discussed in the Japanese Patent Application Laid-Open No. 11-283425 implements illumination of the touch switch with sufficiently intense light by using two light sources provided at both ends of the switch illumination range. However, using two light sources is less useful than the single light source configuration in terms of lower costs and the resulting highly free arrangement of components.

Furthermore, it may be difficult to apply the illumination device discussed in the Japanese Patent Application Laid-Open No. 11-283425 as a backlight for illuminating the capacitance touch switch discussed in the U.S. Patent Application Publication No. 2009/0033636 A1 with light because of the following reason.

More specifically, if the structure discussed in the U.S. Patent Application Publication No. 2009/0033636 A1 is employed, an air gap may arise in or around the exit window 11. If an air gap exists between the surface of a touch panel, which is touched by an operator with his finger, and an electrode, it may become difficult to detect the capacitance.

Accordingly, if an electrode is provided in the structure discussed in the U.S. Patent Application Publication No. 2009/0033636 A1, it is required to provide the electrode outside the exit window (11) (i.e., on the back side of an LCD display device (12). Therefore, the electrode may interfere with the light emitted from the backlight. Accordingly, in this case, the display may not be appropriately executed.

SUMMARY OF THE INVENTION

The present invention is directed to a device which is, if the area of a region of a touch switch to be illuminated with light is large, capable of implementing the illumination of the region of the touch switch to be illuminated with light from behind with as small uneven luminosity as possible and with the smallest possible number of light sources.

According to an aspect of the present invention, an operation device includes a panel including a light-transmissive portion having a specific shape, a light guide element having a first surface, a second surface, and a plurality of sides, the first surface facing the panel, a light source located opposite a predetermined light-incident side of the light guide element, and an electrode provided at a location corresponding to the light-transmissive portion closer to the second surface of the light guide element and configured to detect a capacitance, wherein a reflection portion is formed in a first region, which is close to the light source, of the second surface of the light guide element, a first diffusion surface, corresponding to a range including the light-transmissive portion, is formed in a second region more distant from the light source than the reflection portion, and the light-incident side of the light guide element is a non-diffusion surface and the sides other than the light-incident side are second diffusion surfaces. Light that has been emitted from the light source and incident to the light guide element via the light-incident side is totally reflected on the reflection portion and on the first surface and is then guided to the first and the second diffusion surfaces and a part of diffusion-reflected light illuminates the light-transmissive portion.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the present invention.

DESCRIPTION OF THE EMBODIMENTS

Various exemplary embodiments, features, and aspects of the invention will be described in detail below with reference to the drawings.

In the present specification, apparatuses which have an image reading unit configured to read an image of a document, such as a scanner, a printer, a facsimile apparatus, a copying machine, or an MFP, will be collectively referred to as an "image reading apparatus".

Figure 1A:
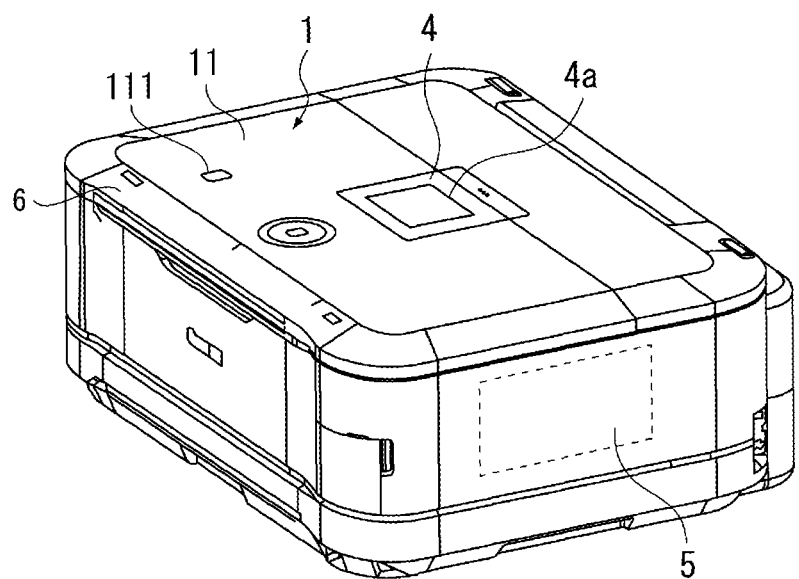
FIGS. 1A and 1B are perspective views illustrating an exemplary configuration of an apparatuses according to an exemplary embodiment of the present invention.
Figure 1B:
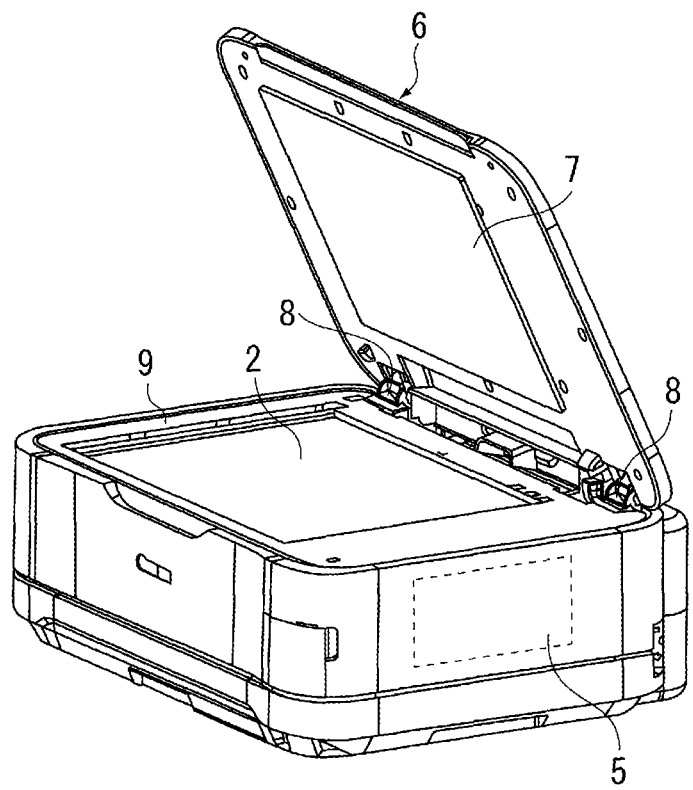

FIGS. 1A and 1B illustrate an exemplary configuration of an image reading apparatus according to an exemplary embodiment of the present invention. FIG. 1A illustrates a state of the image reading apparatus in which a pressing plate thereof is closed while in FIG. 1B, the pressing plate is opened.

The image reading apparatus, within a housing thereof, includes a reading unit having a flatbed scanner, a recording unit, and a control unit 5. The reading unit reads an image of a document set on a reading surface. The recording unit prints a document image read by reading the document on a sheet. The control unit 5 controls an operation of the entire image reading apparatus. The reading unit and the recording unit are implemented by a well-known art, such as the conventional device discussed in the Japanese Patent Application Laid-Open No. 2009-88759. Accordingly, the reading unit and the recording unit will not be described in detail in the present specification.

The control unit 5 is constituted by a controller board, which includes a central processing unit (CPU), a memory, and various input/output (I/O) interfaces. A pressing plate 6 is provided at the top portion of the image reading apparatus and can open on a reading surface 2.

After appropriately installing the image reading apparatus to a user (operator)'s environment, the operator can access the image reading apparatus from the left (the front side) of FIGS. 1A and 1B.

Referring to FIG. 1A, the pressing plate 6 is a document positioning plate cover, which presses the document when closed. A panel unit 1 is provided on the upper surface of the pressing plate 6.

The panel unit 1 includes a panel cover 11. On the panel cover 11, a display unit 4 and various operation keys (input switches) are installed closely to one another. In addition, a power button 111 is installed to the panel cover 11. The operation keys are capacitance touch switches except the power button 111.

The capacitance touch switch is a touch switch that detects the capacitance, which varies when the operator touches its touch-operation surface with his/her finger, and recognizes the detected capacitance as an input. The detailed configuration of and an operation executed by the capacitance touch switch will be described in detail below.

The display unit 4 includes a display window 4a, which is constituted by a transparent member. When the display unit 4 is retracted, the display unit 4 is tilted just onto the surface of the panel cover 11, as illustrated in FIG. 1A. The display unit 4 can be pivoted by the operator to be tilted up to become oriented towards the front of the image reading apparatus. In other words, when the display unit 4 is retracted (pivoted down), a display of the display window 4a can be viewed from above. On the other hand, when the display unit 4 is extended (pivoted up), the display of the display window 4a can be viewed from the front.

The power button 111 has a structure of a mechanical contact key, such as a tactile switch. If the operator presses the power button 111 when the image reading apparatus has been powered off, the apparatus is powered on. On the other hand, if the operator presses the power button 111 when the image reading apparatus has been powered on, the apparatus is powered off.

Referring to FIG. 1B, the pressing plate 6 is pivotably mounted to a frame 9 in a back portion (the opposite portion of the front portion thereof) at two locations by using hinges 8. The reading surface 2 is constituted by a transparent glass plate. The operator sets a document on the upper surface of the reading surface 2 in a face-down state (i.e., with the surface of the document to be read facing downwards). The perimeter of the glass plate is covered with a cover to be mounted to the frame 9.

A press-contact sheet 7 is mounted to the inner (back) surface of the pressing plate 6 in order to prevent floating of the document set on the reading surface 2 by applying pressure onto the document. Vertical play is provided to engagement between the hinge 8 and the pressing plate 6. Accordingly, the image reading apparatus can read an image of a thick book document.

The control unit 5 controls various operations executed by the image reading apparatus. More specifically, the control unit 5 controls an operation of each of the reading unit and the recording unit. In addition, the control unit 5 controls the display by the display unit 4, a switch input that is input by an operation on the touch switch, and the display of the touch switch.

As will be described below, the control unit 5 controls a plurality of operation modes of the image reading apparatus. More specifically, the control unit 5 toggles on and off a backlight of the touch switch (i.e., light for illuminating the touch switch from behind) according to each selected operation mode.

Figure 2A:
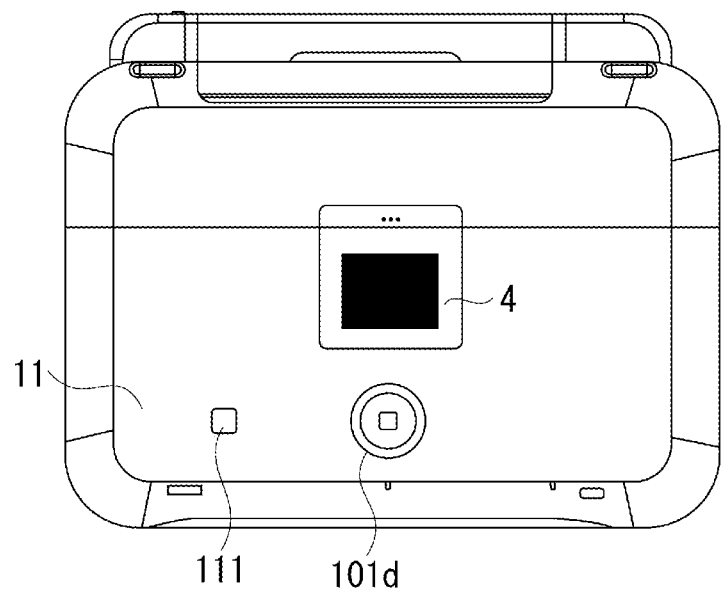
FIGS. 2A and 2B illustrate a state of display on an operation panel in each of power-off and power-on states.
Figure 2B:
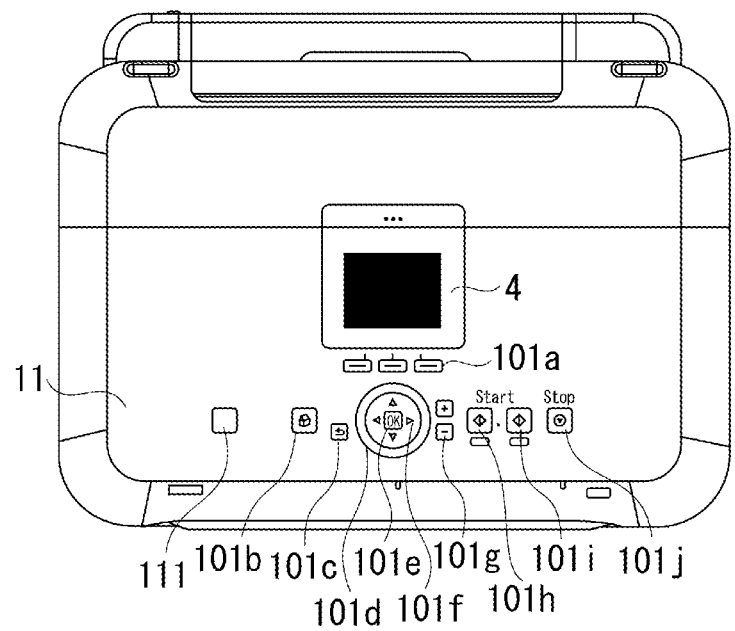

FIGS. 2A and 2B are top views of the image reading apparatus, which illustrate a status of display on an operation panel (operation device) provided to the panel cover 11 on the upper surface of the pressing plate 6.

In the example illustrated in FIG. 2A, the image reading apparatus has been powered off. Various operation keys of an operation unit of the image reading apparatus are out of view of the operator except the power button 111 and a jog wheel 101d.

In the example illustrated in FIG. 2B, the image reading apparatus has been powered on and all the operation keys are displayed in a lit state. When the key is displayed in a lit state, the operator can validly input information via the operation key displayed in the lit state.

In the example illustrated in FIG. 2B, the operation key includes a home key 101b, a return key 101c, which can be operated to a previous state, a monochromatic copy key 101h, a color copy key 101i, and a stop key 101j. The monochromatic copy key 101h is a key for instructing the start of a monochromatic copy operation or a monochromatic image scan operation. The color copy key 101i is a key for instructing the start of a color copy operation or a color image scan operation. The stop key 101j is a key for instructing the discontinuation of the current copy operation or scan operation.

In addition, the operation key includes a function key 101a. The function key 101a is constituted by three keys, which can be operated for selecting a display item displayed on a screen of the display unit 4. Furthermore, the operation key includes four-arrow (four-direction) key 101f and a jog wheel 101d. The four-direction key 101f can be operated to move a cursor up, down, left, or right on the screen displayed on the display unit 4. The jog wheel 101d has a wheel-like shape and can be operated to move the cursor.

The operation key includes an OK key 101e and plus-minus ("+" and "−") keys 101g. The OK key 101e can be operated to finally inputting an operator selection. The plus-minus keys 101g can be operated to set numerical values, such as the number of copies.

Each of the above-described operation keys is a capacitance touch switch, which includes a backlight. The backlight of each operation key can be independently turned on or off. When the backlight is turned on, a graphic (mark), which is uniquely assigned to the corresponding key, is displayed. Accordingly, the operator can easily recognize the operation key. On the other hand, when the backlight of the operation key is turned off, the mark on the key become hardly recognizable for the operator. Note that the meaning of "turned off" contains not only the backlight becoming off completely, but also becoming alight with a weak power.

Figure 3A:
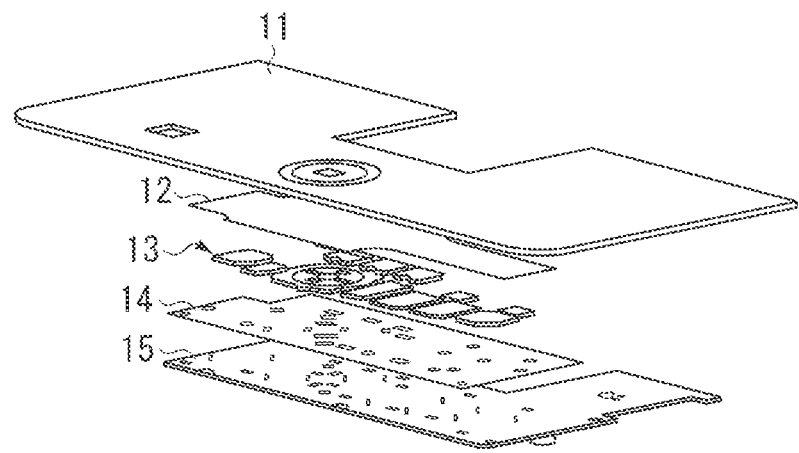
FIGS. 3A and 3B illustrate an exemplary structure of a panel unit.
Figure 3B:
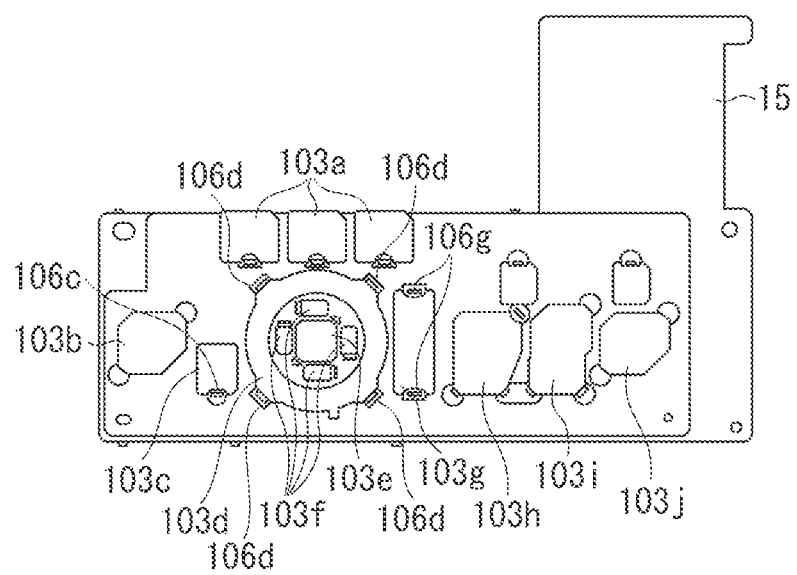

FIGS. 3A and 3B illustrate an exemplary configuration of the panel unit 1. More specifically, FIG. 3A is an exploded perspective view of a laminated structure of the panel unit 1. FIG. 3B is a top view of the panel unit 1.

Referring to FIG. 3A, the panel unit 1 includes a five-layer laminated structure including, in order from the front (upper) surface to the back (bottom) surface, the panel cover 11, an elastic sheet 12, a light guide element group 13, an elastic sheet 14, and a circuit substrate 15. The panel unit 1, as a whole, is an integrated structural member, which is closely laminated together by using the elastic sheet 12 and the elastic sheet 14.

More specifically, the elastic sheet 12 (a first elastic sheet), which is a translucent sheet, is laminated between the panel cover 11 and the light guide element group 13 to closely attach the panel cover 11 and the light guide element group 13 together.

Similarly, the elastic sheet 14 (a second elastic sheet), which has a sheet-like shape, is inserted between the light guide element group 13 and the circuit substrate 15 to closely attach the light guide element group 13 and the circuit substrate 15 together. It is not necessary that the elastic sheet 14 is translucent. Both the elastic sheets 12 and 14 are made of a nonconductive insulating material.

The panel cover 11 is an integrated seamless board-like transmissive (transparent or translucent) member. The panel cover 11 is made of a plastic material, such as acryl, acrylonitrile butadiene styrene (ABS), polycarbonate (PC), methyl methacrylate-butadiene-styrene resin (MBS), or styrenic-block-copolymers (SBC), or a glass material.

Each of the elastic sheets 12 and 14 is one integrated (non-divided) sheet, which is commonly provided for a plurality of electrodes. Because each of the elastic sheets 12 and 14 is an integrated (non-divided) sheet, it becomes easy to assemble the operation panel.

In assembling the operation panel, the panel cover 11 and the light guide element group 13 should be completely closely attached together by laminating the elastic sheet 12 between them without any gap or space. This is because if the panel cover 11 and the light guide element group 13 are not completely closely attached together and if an air gap of low conductivity may arise due to the loose attachment between them, variation of the capacitance may not be stably detected. As a result, the reliability of the capacitance touch switch may degrade.

Furthermore, in order to easily exchange the panel cover 11 in a maintenance operation, the elastic sheet 12 should be easily removable, even after they are once closely laminated, without any residual bond. In order to achieve the sufficiently close attachment properties and the highly easy removability of the elastic sheet 12 at the same time, the present exemplary embodiment uses a self-tack elastic sheet for the elastic sheet 12, which can be adhered without using a bond. For the elastic sheet described above, a gel sheet can be used.

The elastic sheet 14, which is used for closely attaching the light guide element group 13 and the circuit substrate 15 (on the surfaces of the plurality of electrodes) together, has the same characteristic as that of the elastic sheet 12. Accordingly, for the elastic sheet 14, the self-tacking elastic sheet, such as a gel sheet, can be used.

It is not always necessary that both the elastic sheets 12 and 14 are gel sheets. In other words, either one of the elastic sheets 12 and 14 only can be a gel sheet. In addition, a sheet which is different from a gel sheet and made of a material having the same self-tacking properties and elasticity can be used as the elastic sheets 12 and 14. Furthermore, a two-sided adhesive tape that cannot be easily damaged when removed, such as a two-sided adhesive tape made by using polyethylene terephthalate (PTE), can be used.

FIG. 3B illustrates an exemplary arrangement of light guide elements, which are included in the light guide element group 13 and arranged on the circuit substrate 15.

Referring to FIG. 3B, the light guide element group 13 includes light guide elements 103a through 103j, which are arranged at locations corresponding to touching locations of the capacitance touch switch. In addition, one or more light sources are installed on the circuit substrate 15 for each light guide element.

For example, the light guide element 103c and one light source 106c are provided to illuminate the return key 101c. Furthermore, the light guide element 103g and two light sources 106g are provided to illuminate the plus-minus ("+" and "−") key 101g. In addition, the light guide element 103d and four light sources 106d are provided to illuminate the jog wheel 101d.

Figure 4:
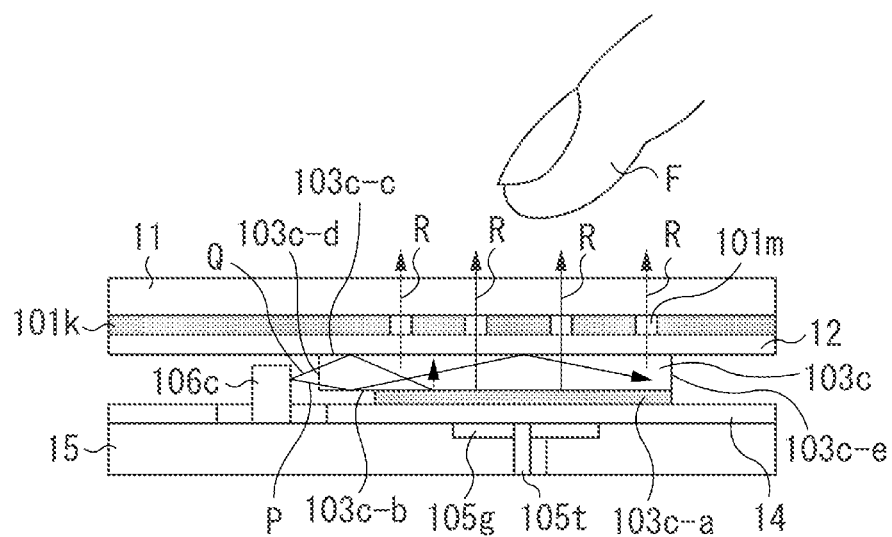
FIG. 4 is a cross section of a capacitance touch switch.

FIG. 4 is cross section of the capacitance touch switch at the return key 101c. As described above, the panel unit 1 includes a five-layer laminated structure including the panel cover 11, the elastic sheet 12, the light guide element 103c, the elastic sheet 14, and the circuit substrate 15. No air gap exists within the panel unit 1.

On the surface of the panel cover 11 on its back side, a light-shielding layer 101k is formed by printing that uses a black ink. On the light-shielding layer 101k, a transmissive graphic portion 101m, which includes a light-transmissive portion having a predetermined shape that is partially not subjected to printing using the black ink, is formed.

Viewed from above, the transparent graphic portion 101m takes a specific graphical shape. In the example illustrated in FIG. 4, the transparent graphic portion 101m takes a shape of a graphic constituted by a "return" arrow symbol surrounded by a rectangle as the return key 101c (FIG. 2B).

The panel cover 11 is translucent. Accordingly, if the transparent graphic portion 101m is illuminated with light by the backlight from behind (from the bottom), the graphical shape of the transparent graphic portion 101m can be recognized by the operator. If the backlight is turned off, the graphical shape of the transparent graphic portion 101m is not illuminated with light (i.e., turns completely dark to become less recognizable). Therefore, in this state, the operator cannot recognize the graphical shape of the transparent graphic portion 101m.

As a result of an experiment conducted by the inventors, by using the panel cover 11 made of a translucent gray/smoke material, it became very difficult for the operator to visually recognize the transparent graphic portion 101m when the backlight had been turned off. In this state, the graphical shape of the transparent graphic portion 101m was actually invisible for the operator. Accordingly, the contrast between the graphical display on-state and the graphical display off-state became more intense.

The panel cover 11 is constituted by one integrated board-like member. Accordingly, if the backlight is turned off, the switches except the power button 111, the jog wheel 101d, and the OK key 101e become less recognizable. Accordingly, in this state, the operator would not be annoyed at which switch to operate. In addition, in this state, the beauty of the image reading apparatus can be increased.

The light source 106c, which is constituted by a semiconductor light source, is mounted onto the circuit substrate 15 at one location thereof. For the semiconductor light source, a light-emitting diode (LED) or an organic light emitting diode (OLED) can be used.

In the present exemplary embodiment, the light is emitted from the light source 106c in a direction horizontal to the surface of the operation panel and in a direction of incidence of light to the light guide element 103c via the side of the light guide element 103c.

When the light source 106c is turned on, a diffused light flux is incident to the light guide element 103c. The diffused light flux that has been incident to the light guide element 103c is repeatedly reflected within the light guide element 103c to be further transmitted.

On a part of the bottom surface of the light guide element 103c, a diffusion surface 103c-a is formed by applying white coating thereon. After being incident on the diffusion surface 103c-a, the light is diffusion-reflected and a part thereof is diffused upwards (in a direction indicated by an arrow "R".

The diffusion-reflected part of the light is emitted out of the transparent graphic portion 101m. The other part of the light is shielded by the light-shielding layer 101k. Accordingly, the "return" arrow is visually recognized by the operator. As described above, the backlight is constituted by the light source and the light guide element.

At a location of the circuit substrate 15 immediately below a position for touching the surface of the panel cover 11 with the fingertip F, one electrode 105g is installed, which is used for detecting the state of switching of the return key 101c. In addition, a signal processing circuit (including a processor), which is electrically connected to each electrode, is installed on the circuit substrate 15.

The signal processing circuit converts the variation of the capacitance, which is detected at the electrode, into digital data. Furthermore, the signal processing circuit executes signal processing to determine the status of switching (whether the operator has touched the panel cover 11 on the touching surface thereof) by using parameter values "on" and "off".

When the operator touches the panel cover 11, the region of the panel cover 11 touched by the operator by the fingertip F and the electrode 105g function as a kind of a capacitor together. Accordingly, when the operator touches the surface of the panel cover 11 with his fingertip F, the capacitance varies.

The signal processing circuit determines whether the panel cover 11 has been touched by the operator according to a result of detection of the variation of the capacitance by using the electrode 105g.

If an input via the touch switch has been previously enabled, the signal processing circuit determines that a switch input has been executed (that the switch has been set "on") if the capacitance detected by the electrode has exceeded a predetermined threshold value. On the other hand, if an input via the touch switch has been previously disabled, the signal processing circuit discards the capacitance detected by using the electrode or raises the above-described predetermined threshold value.

A through hole 105t is formed on the circuit substrate 15 at the location of the electrode 105g. The air is released from the through hole 105t when attaching the light guide element group 13 and the circuit substrate 15 together by using the elastic sheet 14 on a large area. Accordingly, an air gap cannot easily arise between the elastic sheet 14 and the surface of the electrode.

As described above, the present exemplary embodiment employs the gel sheet having high close-attachment properties as the elastic sheet 14. In addition, the present exemplary embodiment provides the through-hole to the circuit substrate 15. Due to a synergetic effect of these effects, no air gap can easily arise during assembly of the operation panel. It is not necessary that the through hole 105t is provided all through the electrode 105g from the upper surface to the bottom thereof. In other words, the through hole 105t can be located near the electrode 105g.

Now, the light guide element, which is used for each key described above, will be described in detail below with reference to FIGS. 5A and 5B. In the following description, the return key 101c will be described as a representative of all the keys including the other ones. However, some of the other keys (for example, the function key 101a and the arrow key 101f) have the same configuration as will be described below.

Figure 5A:
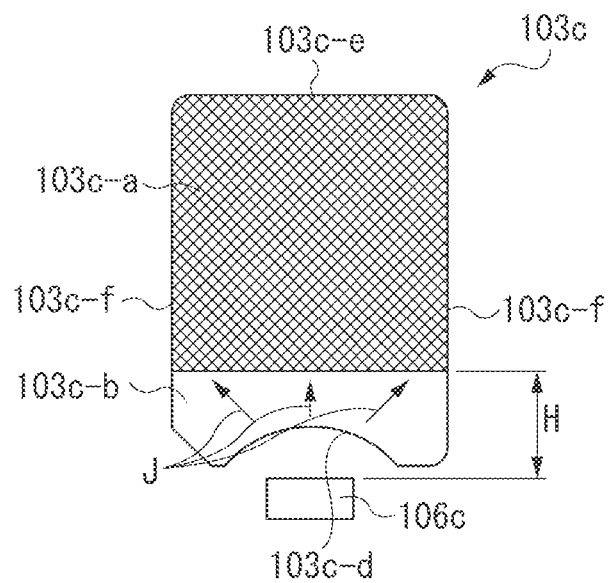
FIGS. 5A and 5B illustrates an exemplary structure of a light guide element.
Figure 5B:
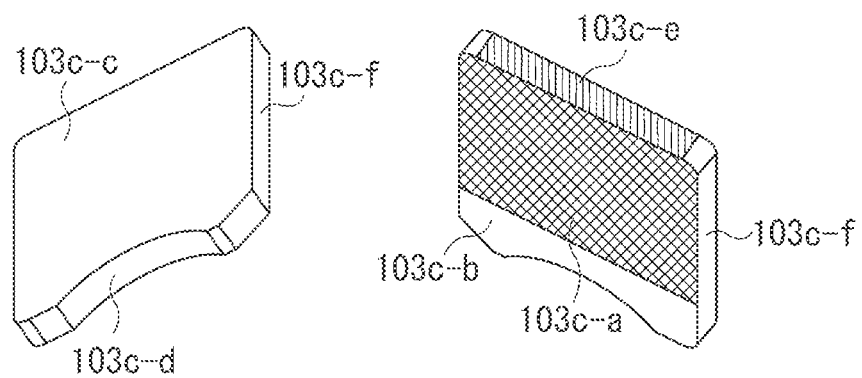

FIGS. 5A and 5B illustrate an exemplary configuration of the light guide element 103c corresponding to the return key 101c. More specifically, FIG. 5A is a top view of the light guide element 103c. FIG. 5B is a perspective view of the light guide element 103c.

The light guide element 103c is made of transparent glass or plastic. Viewed from above, the light guide element 103c takes a rectangular shape. One light source 106c, which corresponds to the light guide element 103c, is provided adjacent thereto. The light guide element 103c has a first surface (upper surface) 103c-c and a second surface (bottom surface), which are parallel to each other. In one portion of the second surface (i.e., in a second region relatively distant from the light source), the diffusion surface 103c-a is formed.

The diffusion surface 103c-a is formed corresponding to a range including the light-transmissive portion of the return key, which forms the graphic. The diffusion surface 103c-a is formed by printing or applying, by hand, the white coating on the surface of the light guide element, as described with reference to FIGS. 5A and 5B. The light incident to the diffusion surface 103c-a is diffusion-reflected by microscopic asperities on the coating.

A total reflection portion 103c-b is formed in a first region of the second surface of the light guide element 103c, in which no diffusion surface 103c-a has been formed. Both the total reflection portion 103c-b and the first surface 103c-c are mirror-finished. Accordingly, light is totally reflected thereon or transmitted therethrough.

A side 103c-d of the light guide element 103c, via which the light from the light source 106c is incident to the light guide element 103c (i.e., a predetermined light-incident side of the light guide element 103c), is a mirror-finished non-diffusion surface. Viewed from above, the side 103c-d is a concave surface having an arch-like shape. With a synergetic effect between an effect that the light-incident surface is the non-diffusion surface and an effect the light-incident surface has a concave surface having an arch-like shape, the light emitted from the light source 106c can be efficiently incident to the light guide element 103c.

A rear side 103c-e, which is opposite the side 103c-d of the light guide element 103c, has a diffusion surface, which is achieved by graining or applying a white paint on a mirror-finished surface. Light incident to the light guide element 103c via the rear side 103c-e is diffusion-reflected thereon. Similarly, a side 103c-f of the light guide element 103c has a diffusion surface, which is achieved by graining or applying a white paint on a mirror-finished surface.

As described above, the diffusion surface 103c-a (first diffusion surface) on a portion of the second surface of the light guide element 103c and all the plurality of sides of the light guide element 103c except the light-incident surface are diffusion surfaces (second diffusion surface).

As illustrated in FIG. 4, the light emitted from the light source 106c is guided into the light guide element 103c via the light-incident side within the range of an angle of directivity of the light source 106c, which is regulated by arrows P and Q when viewed from the side. The light goes in the direction indicated by the arrow P and then is incident to the total reflection portion 103c-b, which is the second surface of the light guide element 103c. Because the angle of incidence is higher than the critical angle, the light is totally reflected on the total reflection portion 103c-b. Accordingly, the light can be guided further into the light guide element 103c with almost no loss of the amount of the light.

Similarly, the light going in the direction indicated by the arrow Q is incident to the total reflection portion 103c-b, which is the first surface of the light guide element 103c, and is then totally reflected. Accordingly, the light is further guided into the light guide element 103c with almost no loss of the amount of light.

Of the light guided into the light guide element 103c, the portion of the light incident to the diffusion surface 103c-a is then diffusion-reflected. Of the diffusion-reflected light, the portion going in the direction of the first surface (i.e., in the direction indicated by an arrow R) goes above the translucent portion of the transparent graphic portion 101m, which can be then visually recognized by the operator.

As described above, on the total reflection portion 103c-b, which has been formed in the first region of the second surface of the light guide element 103c and near the light source, the light is incident at the angle of incidence higher than the critical angle, which is defined by the difference between the refractive index of the material of the light guide element 103c and the refractive index of the air or the elastic sheet. Accordingly, the amount of light cannot be substantially lost.

On the other hand, on the diffusion surface 103c-a formed in the second area distant from the light source, no medium contacts the light guide element because the surface is coated with the white paint that is not translucent. Accordingly, the light is diffusion-reflected without being totally reflected.

Viewed from above, as illustrated in FIG. 5A, the light emitted from the light source 106c is incident to the light guide element 103c via the side 103c-d and goes in a diverged manner as indicated by an arrow J. Because the side 103c-d is not a diffusion surface, the amount of loss of light is small.

The light incident to the rear side 103c-e and both sides 103c-f is diffusion-reflected. A part of the diffusion-reflected light is incident to the diffusion surface 103c-a of the second surface to be further diffusion-reflected and to illuminate the transparent graphic portion 101m therewith.

As described above, the side which the light emitted from the light source 106c cannot reach is used as the diffusion surface. Accordingly, the present exemplary embodiment can reduce partial degradation of the brightness, which may otherwise occur near the side.

In addition, the amount of loss of light on the side 103c-d, which is provided closer to the light source, is small. Accordingly, the total brightness may increase. Moreover, because a light transmission unit (the total reflection portion 103c-b and the opposite surface), which totally reflects the incident light, is provided between the light source 106c and the diffusion surface 103c-a. Therefore, the light source 106c and the diffusion surface 103c-a can be provided with a distance H instead of providing the same adjacent to each other. The distance H is defined according to a predetermined directional angle of the light source 106c.

With the above-described configuration, the light is incident to the diffusion surface 103c-a after the light flux has been expanded. Accordingly, even if the area of the diffusion surface 103c-a is large, the entire diffusion surface 103c-a can be uniformly illuminated with the light.

If the distance H is short, the incident light flux is diverged in the region of the diffusion surface 103c-a in a fan-like shape. Accordingly, a "dead" region may arise, which the light cannot reach. Therefore, because the dead region may become dark, it is difficult to uniformly illuminate the diffusion surface 103c-a with light in this case. By providing the light transmission unit which totally reflects light, the present exemplary embodiment prevents a dead region from arising.

With the above-described configuration, if the area of the touch switch is large, the device according to the present exemplary embodiment can illuminate the touch switch with highly bright backlight without any uneven brightness and with as small a number of light sources as possible.

In addition, the apparatus of the present exemplary embodiment having the above-described configuration includes the operation panel having the capacitance touch switch on the upper surface of the pressing plate.

Compared with a general mechanical switch, the switching surface of the capacitance touch switch can be more firmly constructed. Of the capacitance touch switch and a pressure-sensitive touch switch, the surface of the capacitance touch switch can be more firmly constructed. Accordingly, if the operator has pressed the switching surface of the switch in pressing the document by placing his hand on the pressing plate, the apparatus according to the present exemplary embodiment, which employs the capacitance touch switch as described above, can bear a very high pressure force.

It is particularly useful to employ the capacitance touch switch because it is necessary for the operator to press a book document by the pressing plate with a very high pressing force. Because the upper surface of the pressing plate is an exposed surface, the operator may spill some liquid of a beverage thereon or may bump a foreign material thereon.

The capacitance switch which the exemplary embodiment of the present invention employs has a high resistance to a case where if any beverage is spilled or if a local impactive force is applied to the touch switch.

With the above-described configuration, the apparatus according to the exemplary embodiment of the present invention includes the backlights, each of which is provided for each of the plurality of touch switches and which can be turned on and off independently from one another. Accordingly, the apparatus toggles each backlight for each of the corresponding touch switches on and off according to the operation mode.

If the backlight corresponding to a key via which an input can be validly executed only is lit, the operator who is not accustomed to operate the apparatus may not be annoyed for deciding which touch switch to operate.

In addition, when the operator presses a document by the pressing plate, if the backlight for the touch switch corresponding to an unused key has been turned off, the operator can positively execute an operation via the operation panel because the switch is appropriately invisible in this case.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-131253 filed Jun. 8, 2010, which is hereby incorporated by reference herein in its entirety.

What is claimed is:

1. An operation device comprising:
   a panel including a light-transmissive portion having a specific shape;
   a light guide element having a first surface, a second surface, and a plurality of sides, the first surface facing the panel;
   a light source located opposite a predetermined light-incident side of the light guide element; and
   an electrode provided at a location corresponding to the light-transmissive portion closer to the second surface of the light guide element and configured to detect a capacitance,
   wherein a reflection portion is formed in a first region, which is close to the light source, of the second surface of the light guide element, a first diffusion surface, corresponding to a range including the light-transmissive portion, is formed in a second region more distant from the light source than the reflection portion, and the light-incident side of the light guide element is a non-diffusion surface and the sides other than the light-incident side are second diffusion surfaces, and
   wherein light that has been emitted from the light source and incident to the light guide element via the light-incident side is totally reflected on the reflection portion and on the first surface and is then guided to the first and the second diffusion surfaces and a part of diffusion-reflected light illuminates the light-transmissive portion.

2. The operation device according to claim 1, wherein the light-incident side is a concave surface having an arch-like shape.

3. The operation device according to claim 1, wherein the panel and the first surface of the light guide element closely contact each other, and
   wherein the second surface of the light guide element and the electrode closely contact each other.

4. The operation device according to claim 3, wherein the panel and the first surface of the light guide element are translucent and are in close contact with each other via a first elastic sheet having non-conductivity, and
   wherein the second surface of the light guide element and the electrode are in close contact with each other via a second elastic sheet having non-conductivity.

5. The operation device according to claim 1, further comprising:
   a plurality of touch switches, to each of which the light-transmissive portion, the light guide element, the light source, and the electrode, that correspond to each touch switch, are provided; and
   a control unit configured to control a state of the light source corresponding to each touch switch to display a graphic corresponding to a touch switch via which an input can be validly input and not to display a graphic corresponding to a touch switch via which an input cannot be validly input.

6. An image reading apparatus comprising:
   a reading unit configured to read a document set on a reading surface;
   a pressing plate capable of opening relative to the reading surface; and
   the operation device according to claim 1, which is provided on an upper surface of the pressing plate.

7. An illumination device comprising:
   a panel including a light-transmissive portion having a specific shape;
   a light guide element having a first surface, a second surface, and a plurality of sides, the first surface facing the panel; and
   a light source located opposite a predetermined light-incident side of the light guide element,
   wherein a reflection portion is formed in a first region, which is close to the light source, of the second surface of the light guide element, a first diffusion surface, corresponding to a range including the light-transmissive portion, is formed in a second region more distant from the light source than the reflection portion, and the light-incident side of the light guide element is a non-diffusion surface and the sides other than the light-incident side are second diffusion surfaces, and
   wherein light that has been emitted from the light source and incident to the light guide element via the light-incident side is totally reflected on the reflection portion and on the first surface and is then guided to the first and the second diffusion surfaces and a part of diffusion-reflected light illuminates the light-transmissive portion.

* * * * *